(12) United States Patent
Hasegawa et al.

(10) Patent No.: US 6,184,124 B1
(45) Date of Patent: Feb. 6, 2001

(54) METHOD OF MAKING EMBEDDED WIRING SYSTEM

(75) Inventors: Makiko Hasegawa; Yoshihiko Toyoda; Takeshi Mori; Tetsuo Fukada, all of Tokyo (JP)

(73) Assignee: Mitsubishi Denki Kabushiki Kaisha, Tokyo (JP)

( * ) Notice: Under 35 U.S.C. 154(b), the term of this patent shall be extended for 0 days.

(21) Appl. No.: 09/078,510

(22) Filed: May 14, 1998

Related U.S. Application Data (62) Division of application No. 08/715,446, filed on Sep. 18, 1996, now Pat. No. 5,793,112.

(30) Foreign Application Priority Data

Apr. 11, 1996 (JP) .................................................... 8-089507

(51) Int. Cl.⁷ .......................... H01L 21/4763; H01L 21/44
(52) U.S. Cl. .......................... 438/625; 438/626; 438/629; 438/631; 438/633; 438/666
(58) Field of Search .................... 438/622, 625–627, 438/629, 631, 633, 637, 666, 667, 672, 674, 675; 257/758, 774, 762, 763, 413, 764, 767, 760

(56) References Cited

U.S. PATENT DOCUMENTS

| | | | |
|---|---|---|---|
| 4,916,397 | 4/1990 | Masuda et al. | 357/71 |
| 4,933,743 | 6/1990 | Thomas et al. | 357/71 |
| 5,008,730 | 4/1991 | Huang et al. | 357/68 |
| 5,262,354 | 11/1993 | Cote et al. | 437/195 |
| 5,374,849 | 12/1994 | Tada | 257/751 |
| 5,391,906 | 2/1995 | Natsume | 257/379 |
| 5,442,235 | 8/1995 | Parrillo et al. | 257/758 |
| 5,592,024 * | 1/1997 | Aoyama et al. | 257/751 |

FOREIGN PATENT DOCUMENTS

| | | |
|---|---|---|
| 0491543 | 6/1992 | (EP) . |
| 6120219 | 4/1994 | (JP) . |
| 7-130733 * | 5/1995 | (JP) . |

OTHER PUBLICATIONS

Ueno et al., "A Half–Micron Pitch Cu Interconnection Technology", 1995 Symposium on VLSI Technology, Digest of Technical Papers, pp. 27–28.

* cited by examiner

Primary Examiner—Mary Wilczewski
(74) Attorney, Agent, or Firm—Leydig, Voit & Mayer, Ltd.

(57) ABSTRACT

A method of preparing a multilevel embedded wiring system for an IC comprising a first wiring formation step, a first connecting portion formation step, and a second wiring formation step, wherein the first wiring formation step comprises forming a first trench for a first embedded wiring in a first insulating layer disposed on a substrate and embedding in the first trench, in turn, a first conductive layer and a first conductive capping layer; the first connecting portion formation step comprises forming a second insulating layer on the first insulating layer and the first conductive capping layer, forming a via-hole in a part of the second insulating layer at the first conductive capping layer, and embedding a conductive connecting portion in the via-hole and connected to the first conductive layer; and the second formation step comprises forming a third insulating layer on the second insulating layer and the conductive connecting portion, forming a second trench for a second wiring in the third insulating layer at the conductive connecting portion, and embedding a second conductive layer in the second trench and connected to the conductive connecting portion.

9 Claims, 9 Drawing Sheets

Trench formation

Fig.9(b)

TiN,Cu layer formation

Fig.9(c)

CMP

Fig.9(d)

TiWN layer formation

Fig.9(e)

CMP

Fig.9(f)

SiO2 layer formation

Fig.9(g)

Via-hole formation

Fig.9(h)

TiN,W layer formation

Fig.9(i)

Etch-back

Fig.9(j)

SiO2 formation

Fig.9(k)

Second wiring system formation [repeat steps of (a) to (e)]

METHOD OF MAKING EMBEDDED WIRING SYSTEM

This application is a divisional of Ser. No. 08/715,446 filed Sep. 18, 1996 now U.S. Pat. No. 5,793,112.

BACKGROUND OF THE INVENTION

1. Field of the Invention

The present invention relates generally to a wiring system structure for semiconductor devices, especially to a multi-level embedded wiring system structure for an IC and a method of making the wiring system.

2. Description of Related Art

With higher integration of semiconductor devices, finer wiring systems on a substrate are desired, resulting in an decreased life time of the wiring. Therefore, there has been desired in this field a wiring system embedded in an insulating layer formed on a substrate, because that system improves the reliability of produced semiconductor chips. Further, because of a flat surface of the resulting wiring system, it is advantageous to make a multilevel wiring system by building up more than one wiring layers on a first wiring layer.

For making the multilevel embedded wiring system on the substrate, there has been proposed a method which comprises steps of: 1) forming a second insulating layer on a lower wiring embedded in a first insulating layer, 2) forming via-holes on the second insulating layer, 3) filling the via-holes with a conductive connecting material to make an interconnecting portion and 4) forming an upper wiring in a third insulating layer on the second insulating layer to connect the upper wiring to the lower wiring.

However, first it is necessary to make the via-holes in the second insulating layer by patterning the second layer through photolithography. In has been found that, an exposure light tends to make halation on a metal surface of the underlying wiring during the patterning process, resulting in poor accuracy of the via-hole formation and thus bad connection in some cases due to the underlying wiring having a narrow width.

Secondly, Cu materials are recommended to be used for the embedded wiring material because of having a high resistance to electromigration which causes disconnection of wiring and thus a short life of the fine wiring system, as well as a lower resistivity than that of Al. However, the second insulating layer on the lower embedded wiring is best formed by deposition of $SiO_2$ made by the conventional plasma-CVD method, in which the surface of the wiring is exposed to a high temperature oxygen atmosphere. It has been found that the Cu wiring surface is easily oxidized, resulting in high resistivity of the wiring. Further, because of easier diffusion of Cu than Al, it is necessary to prevent Cu diffusion into the insulating layer, reducing the insulation property and the device performance.

SUMMARY OF THE INVENTION

The present invention has been developed to overcome the above-described disadvantages, especially in case of using a Cu wiring material.

It is accordingly an objective of the present invention to provide a multilevel embedded wiring system structure for an IC provided with a conductive capping layer for preventing exposure light halation on a conductive layer during the patterning process.

Another objective of the present invention is to provide a multilevel embedded wiring system structure for an IC provided with a conductive capping layer for preventing conductive layer oxidation that results in an increased resistance of the wiring system and Cu diffusion that results in lowering of the insulation property of the insulating layer.

According to a first aspect of the present invention, there is provided a multilevel embedded wiring system structure for IC comprising channels for a first wiring system embedded in a first insulating layer formed on a substrate; a first conductive layer for a first wiring embedded in said trenches; a conductive capping layer embedded in the trenches for capping and connecting the first conductive layer and having an ability for preventing halation of an exposure light during a process of patterning a second insulating layer to be formed thereon; a second insulating layer formed over said first insulating layer and said conductive capping layer and provided with via-holes; a conductive connecting portion formed in said via-holes for connecting said conductive capping layer with a second conductive layer; a third insulating layer having trenches for a second wiring system; and a second conductive layer for a second wiring to be connected with said conductive connecting portion.

In case of the present multilevel embedded wiring system, there can be provided a flat surface on each wiring system which realize a more than triple embedded wiring system. Especially, the conductive capping layer on the conductive layer can prevent halation of an exposure light during a process of patterning a second insulating layer to be formed on the conductive capping layer, so that the via-holes and thus the conductive connecting portion can be prepared precisely.

In a preferred embodiment, Cu or its alloy (hereinafter referred to as the Cu material) may be used as a first conductive material. Comparing with Al material, the Cu material has a high resistance to electromigration and a low resistance, so that the conductive capping layer provided with an ability for preventing Cu diffusion can prevent Cu of the conductive layer from diffusing into the second insulating layer through the capping layer. Especially, in case of using the Cu material for wiring, trenches for the first and second wiring system should be provided with non-diffusion layers on side and bottom walls of the trenches to prevent the Cu diffusion into the insulating layer through the walls.

If an upper surface of the conductive layer is roughened, a good adherence between the conductive layer and the conductive capping layer can be obtained, resulting in advantages that there can be prevented peeling of the conductive capping layer during a CMP polishing process being applied thereon.

Further, the adherence of the capping layer can be improved by forming the capping layer in a way to get a larger contacting area between the capping layer and the conductive layer, such as a part of the capping layer enters into an upper part of the side walls of the trenches and encloses the top of the conductive material.

The conductive layer may be formed by a conventional Al or its alloy wiring material according to the present invention, because the capping layer on the conductive layer can prevent halation of the exposure light.

Preferably, the capping material may have non-oxidation property, because it can prevent oxidation of the first conductive layer during a process of forming a second insulating layer such as $SiO_2$ by means of CVD.

Examples of the conductive capping material may be selected from the group consisting of Ti, Ta, Mo, Cr, Al, W and their alloys, oxides, and nitrides.

According to an preferred embodiment of the present invention, there can be provided a multilevel embedded wiring system for IC wherein a second conductive capping layer is formed on the second conductive layer of the second wiring system, that is, a more than triple embedded wiring system for IC wherein a second connecting portion and a third conductive layer are formed on the second capping layer and so on.

In case of preparing the first and second conductive layer by the Cu material, it is recommendable to make the conductive capping layer by TiWN and make the conductive connecting portion by W or Cu.

In preparing a multilevel embedded wiring system, according to a second aspect of the present invention, there is provided a method of preparing a multilevel embedded wiring system for IC comprising 1) a first wiring formation step, 2) a first connecting portion formation step and 3) a second wiring formation step, wherein 1) said first wiring formation step comprises steps of: forming trenches for a first embedded wiring in a first insulating layer on a substrate; and embedding in said trenches in turn a first conductive layer and a first conductive capping layer;

2) said first connecting portion formation step comprises steps of:

forming a second insulating layer over said first insulating layer and said first conductive capping layer; forming via-holes in a part of said second insulating layer above said first conductive capping layer; and embedding a conductive connecting portion in said via-holes to be connected with said first conductive capping layer;

3) said second wiring formation step comprises steps: forming a third insulating layer over said second insulating layer and said conductive connecting portion; forming trenches for a second wiring on said third insulating layer above said conductive connecting portion; embedding a second conductive layer in said trenches to be connected with said conductive connecting portion.

Further, the above method may comprises a step of forming diffusion barrier layers in walls of said trenches for the first and second wiring.

In a preferred embodiment according to the present invention, the step of embedding in turn the first conductive layer and the first conductive capping layer in said first trenches may comprise steps of depositing a conductive material over the first insulating layer and in the first trenches; flattening a top surface of the conductive material by means of CMP (Chemical Mechanical Polishing) to remain the conductive material only in said first trenches; forming a recess in the top of the conductive material remaining in said first trenches; and embedding a conductive capping material in the recess. The step of forming a recess may be carried out by means of CMP because a conductive layer structure having a very good flatness can be formed. In case of forming a recess by a CMP overetching process, the recess formation can be made by a single CMP process for polishing the conductive layer. The CMP overetching process may be carried out by use of an etching solution comprising an organic acid such as propionic acid, acetic acid, picric acid, salicylic acid and so on or their mixture solution with hydrogen peroxide, because it is easy to make the recess.

The step of forming a recess may be carried out by means of wet-etching after the CMP treatment. In this case, pH of the etching solution should be set within 2 to 6.5 or 7.5 to 13 according to FIGS. 3 and 4 to keep a determined etching rate while preventing a surface roughness (the surface morphology) of the conductive layer after the etching treatment.

Figure 6:
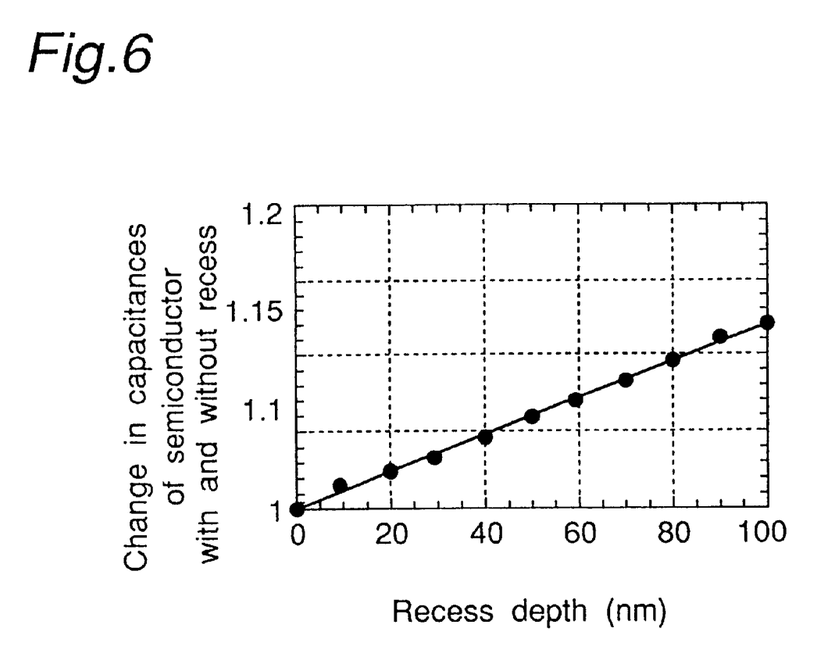
FIG. 6 is a graph showing relation between recess depths and capacitances between the wiring.
Figure 7:
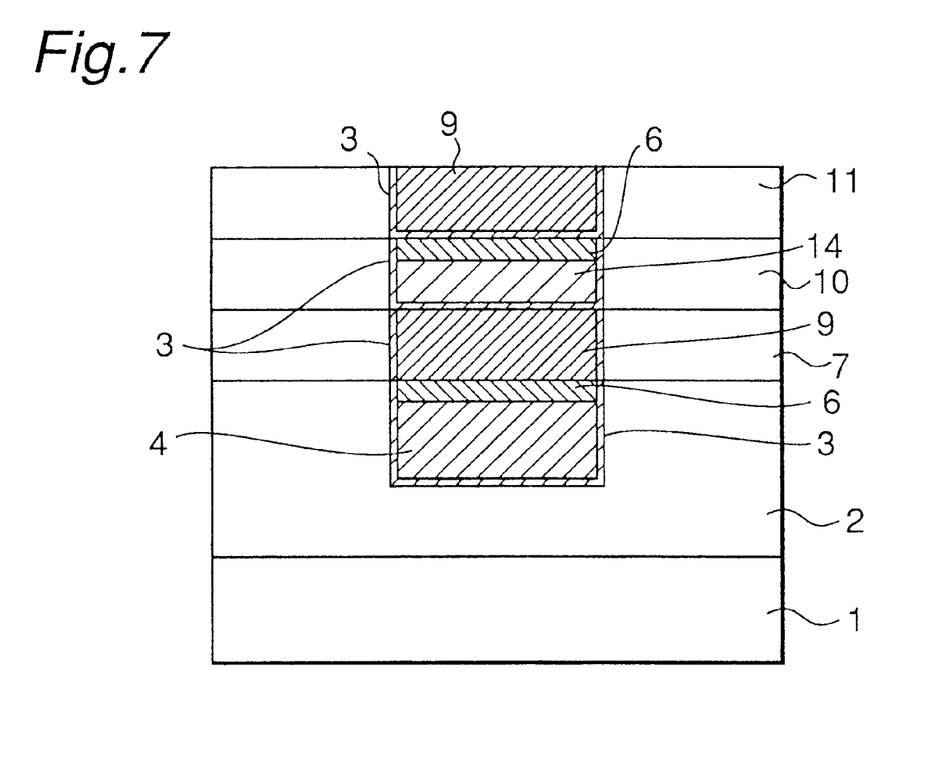
FIG. 7 is a sectional view showing a triple embedded wiring system according to a second embodiment of the present invention.

More than 10 nm of the recess depth or the thickness of the conductive capping layer is needed in order to make the conductive capping layer have a function for preventing surface oxidation of the conductive layer while less than 100 nm of that is preferred in order to prevent a signal delay due to an increased capacity between the wirings from rising more than 10% according to FIG. 6.

In case of using Cu as the conductive material, more than 15 nm of the surface roughness (the surface morphology) of the first conductive layer is preferred in order to improve the adherence between the Cu conductive layer and the TiWN conductive capping layer.

BRIEF DESCRIPTION OF THE DRAWINGS

The above and other objectives and features of the present invention will become more apparent from the following description of a preferred embodiment with reference to the accompanying drawings, throughout which like parts are designated by like reference numerals, and wherein:

FIGS. 2(a)–2(k) are steps in a process of preparing the double wiring system of FIG. 1;

FIGS. 9(a)–9(k) are steps in a process of preparing the double wiring system of FIG. 8.

DETAILED DESCRIPTION OF THE PREFERRED EMBODIMENTS

Embodiment 1

Figure 1:
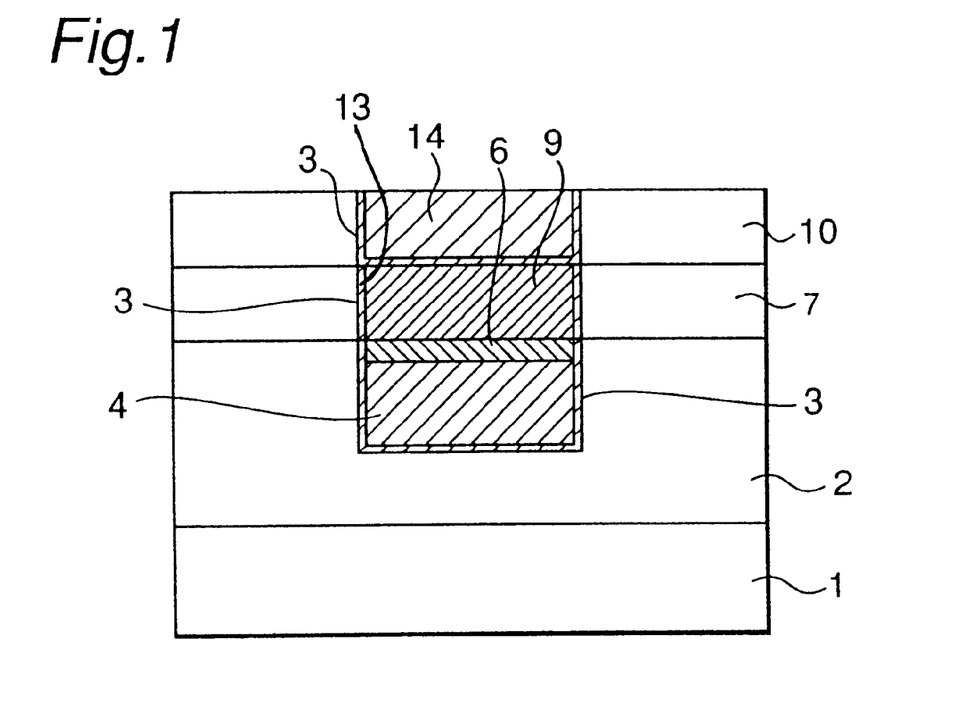
FIG. 1 is a sectional view of a double embedded wiring system according to a first embodiment of the present invention.

FIG. 1 shows a representative multilevel embedded wiring system embodiment according to the present invention, wherein the wiring system is double and the conductive layer 6 is made of Cu.

In FIG. 1, 1 denotes a substrate, on which a first insulating layer 2 is formed. 12 is a trench for a first wiring system embedded in the first insulating layer 2. In the trench 12, there is provided diffusion barrier layer 3, by which a conductive layer 4 and a conductive capping layer 6 are enclosed. 7 is a second insulating layer, in which there is provided a via-hole 8 embedded by a conductive connecting portion 9. 10 is a third insulating layer and 13 is a trench or a second wiring system.

FIG. 2(a)–2(k) are steps of a process diagram of preparing the double embedded wiring system of FIG. 1, which comprises 1) a first wiring formation step including steps (a) to (e) of: forming a trenche 12 for a first embedded wiring in the first insulating layer 2 on the substrate 1; and embedding in the trenche 12, in turn, the first conductive layer 4 and the first conductive capping layer 6. The first conductive capping layer 6 contacts the first conductive layer 4 and can prevent reflection of the exposure light during a patterning process of a second insulating layer 7.

Figure 2A:
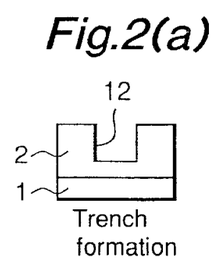
Figure 2B:
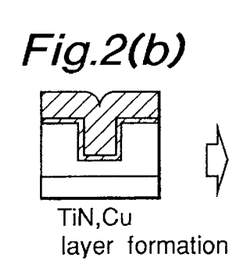
Figure 2C:
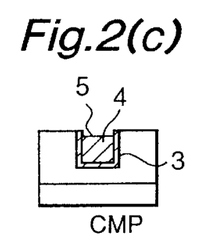
Figure 2D:
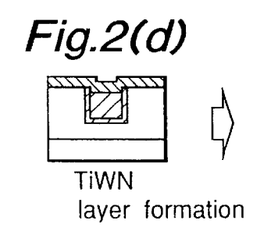
Figure 2E:
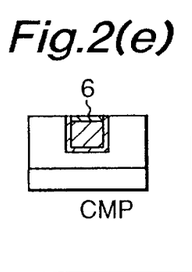
Figure 2F:
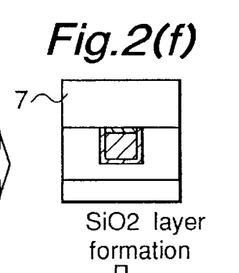
Figure 2G:
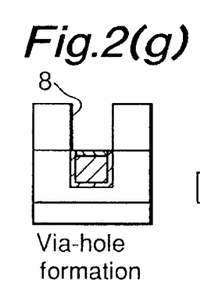
Figure 2H:
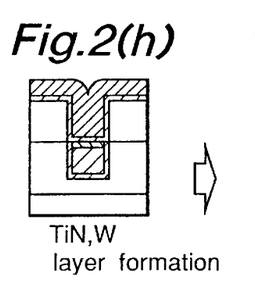
Figure 2I:
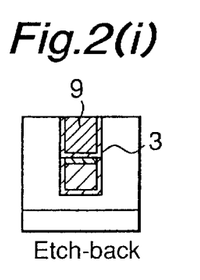

Further, the process comprises 2) a first connecting portion formation step including steps (f) to (i) of: forming a second insulating layer 7 over the first insulating layer 2 and the first conductive capping layer 6; forming via-holes 8 in a part of the second insulating layer 7 above the first conductive capping layer 6; and embedding a conductive connecting portion 9 in the via-hole 8 to contact with said first conductive capping layer 6.

Figure 2J:
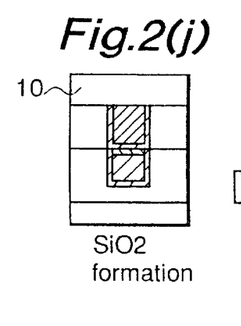
Figure 2K:
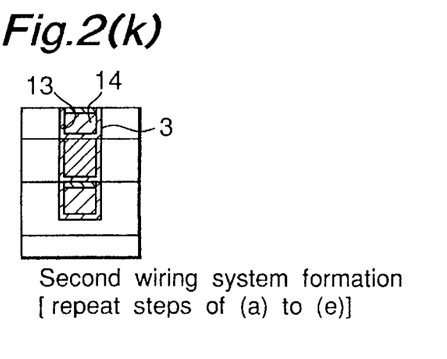

Furthermore, the process comprises 3) a second wiring formation step including steps (i) to (k): forming a third insulating layer 10 over the second insulating layer 7 and the conductive connecting portion 9; forming a trenche 13 for a second wiring on the third insulating layer 10 above the conductive connecting portion 9; embedding a second conductive layer 14 in the trench 13 contact with the conductive connecting portion 9.

In detail, the step (a) of trench formation is carried out by forming the first insulating layer 2 on the substrate 1 and then forming the trench 12 in the first insulating layer 2 by means of dry-etching.

The step (b) of TiN, Cu layer formation is carried out by depositing, in turn, an diffusion barrier material, TiN, and a first conductive material, Cu, over the first insulating layer 2 and in the first trench 12.

The step (c) of CMP is carried out by polishing and flattening the layers TiN and Cu by means of Chemical Mechanical Polishing to form an TiN layer 3 and Cu layer 4 embedded structure and then forming a recess 5 by overetching a top surface of the embedded Cu layer 4 in the trench 12. The overetching process can be carried out by adding hydrogen peroxide to the slurry of CMP.

In place of the CMP treatment, the recess formation can be made by means of Ar sputtering or wet-etching after subjecting the Cu layer to the CMP treatment. Although the number of steps is increased, it is advantageous to prevent dust generation and less scratching of the Cu layer surface.

Figure 3:
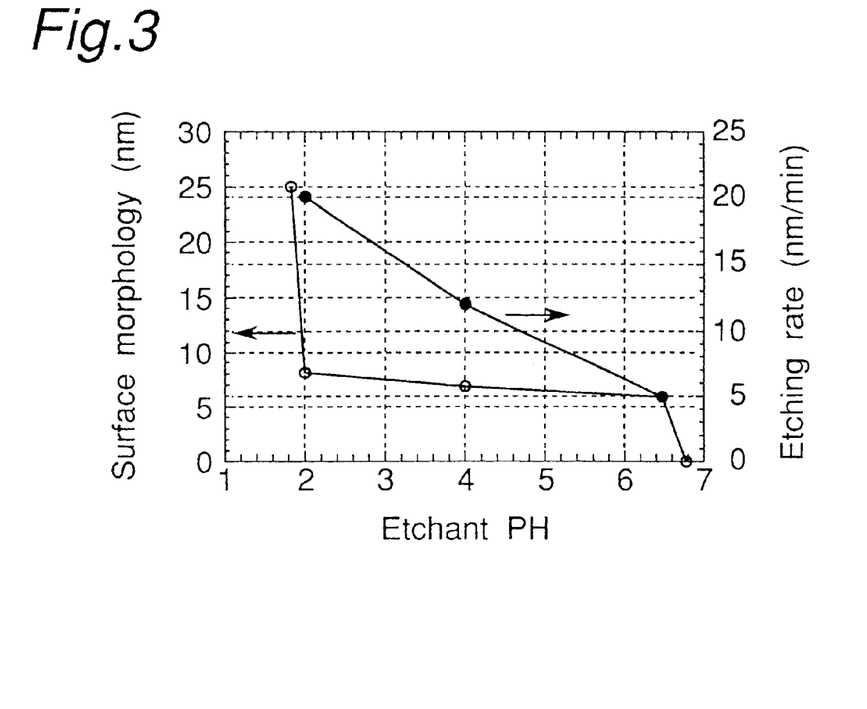
FIG. 3 is a graph showing the relation between pH of an acidic etchant and surface roughness.

FIG. 3 shows a graph showing relation between pH of an acidic etchant and surface morphology of the first conductive layer 4 after etching as well as the etching rate of the first conductive layer 4. The etchant is a mixture of propionic acid and hydrogen peroxide.

As is apparent from FIG. 3, if pH of the etchant is lower than 2, the surface morphology after etching becomes very bad. On the other hand, if pH is larger than 6.5, the etching rate decreases extremely. Accordingly, pH of wet-etching by the acidic etchant is preferred within 2 to 6.5. A similar effect can be obtained by use of another organic acids or strong acids.

Figure 4:
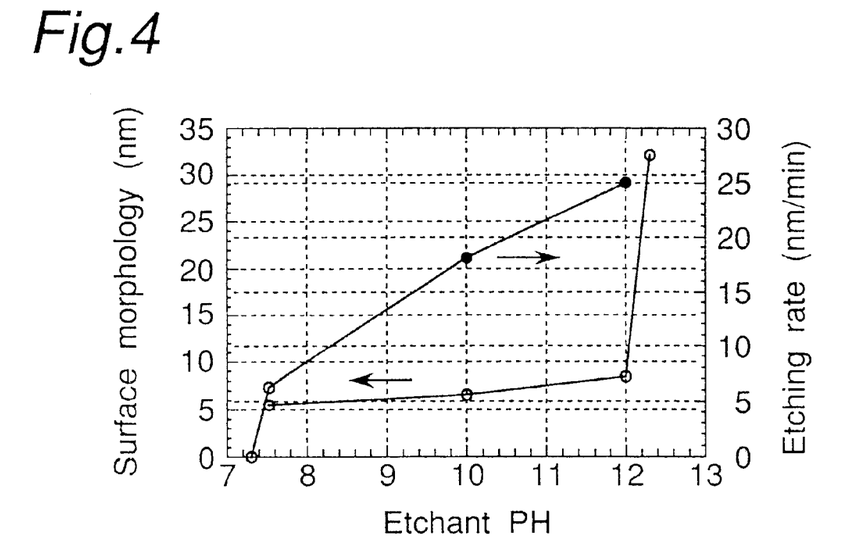
FIG. 4 is a graph showing the relation between pH of an alkali etchant and surface morphology.

FIG. 4 shows the relation between pH of and alkali etchant (potassium hydroxide aqueous solution) and surface morphology and the relation between pH of the alkali etchant and the etching rate of the first conductive layer 4. As is apparent from FIG, 4, a pH of 7.5 to 12 of the etchant is desired in the case of wet-etching by an alkali etchant. Similar effects can be obtained by use of another base.

The step (d) of TiWN layer formation is carried out by depositing a conductive capping material TiWN over the first insulating layer 2 and in the recess 5.

Figure 5:
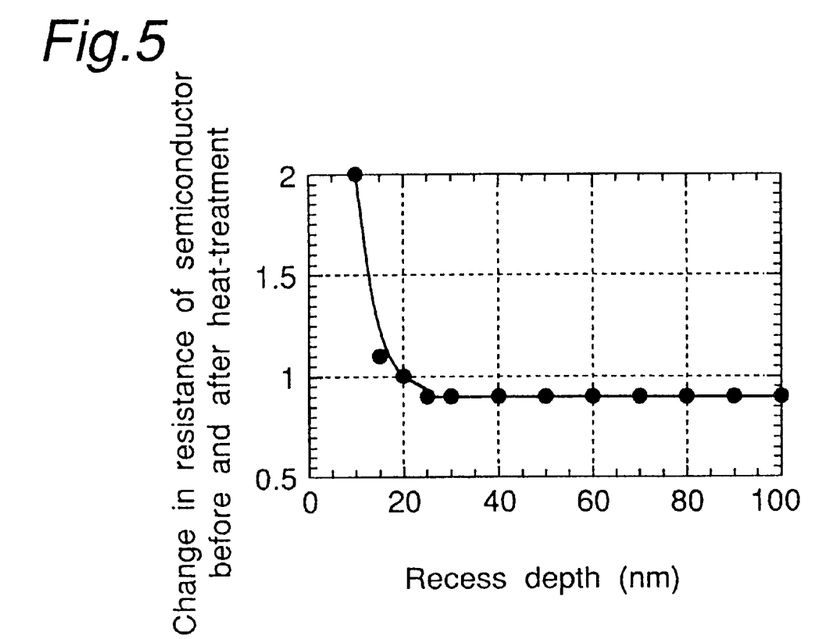
FIG. 5 is a graph showing the relation between recess depths and change in resistance before and after heat-treatment.

The step (e) of CMP is carried out by polishing and flattening the deposited TiWN and forming a conductive capping layer embedded in the recess 5. During the CMP step, it is necessary to prevent peeling of the capping layer 6 from the first conductive layer 4. The adhesion is evaluated by adhering a tape to the TiWN layer and peeling it from the TiWN layer. If the surface morphology of the first conductive layer 4 is less than 12 nm, TiWN layer peeling happened. If it is more than 15 mn, the TiWN layer peeling did not happen. Accordingly, with respect to the surface morphology after forming the recess, more than 15 nm is needed in order to prevent peeling of the TiWN layer during the CMP process FIG. 5 shows the relation between a change in recess depth (thickness of the capping layer) after the step (e) and a change in resistance of the Cu conductive layer before and after heat-treatment. As is apparent from FIG.5, if the recess depth or the thickness of the capping layer 6 is less than 10 nm, the change in the resistance of the conductive layer 4 is a factor more than 2 due to the heat-treatment. That means that, less than 10 nm of the capping layer 6 can not prevent oxidation of the conductive layer 4, so that a depth of more than 10 nm is needed for the recess.

FIG. 6 shows the relation between the depth of the recess after the step (e) and a change in capacitance between the wiring layer. In case of a pair of parallel wirings shown in FIG. 5 (wiring width: 1.2 $\mu$m; space between wirings: 2.4 $\mu$m; thickness of wiring: 0.5 $\mu$m), the deeper the recess 5 becomes, the larger the thickness of the capping layer becomes, so that the capacitance between wiring increases, which causes delay of signal transmission. That is, the thicker of the capping layer becomes, the lower the signal transmission rate of the resulting device becomes.

Considering the maximum permissible delay of the signal transmission on the wiring (about 10%), the recess depth in FIG. 6 should be less than 100 mn.

The step (f) of $SiO_2$ layer formation is carried out by forming a second insulating layer 7 by a plasma-CVD method at a high temperature (300 to 400° C.), so that it is important to prevent diffusion of Cu in the first conductive layer 4 into the insulating layers 2 and 7 as well as to prevent lowering of the insulation property of the insulating layers 2 and 7.

In this embodiment, the first conductive layer 4 is enclosed by the diffusion barrier layer 3 of TiN and the conductive capping layer 6. There was compared the effects with respect to prevention of diffusion with and without the diffusion barrier layer 3 having a thickness of 30 mn. After heat treatment (450° C. for 30 minutes), it was investigated whether the Cu diffusion happened. In case of with the diffusion barrier layer 3, no substantial diffusion (up to 3 nm) was observed, while some diffusion (up to 20 nm deep) could be observed without the diffusion barrier layer 3. Therefore, when using the Cu material as the first conductive material, the diffusion barrier layer is needed to prevent such a diffusion during a thermal oxidation process. In this embodiment, the capping layer 6 made of TiWN has a similar diffusion barrier function, so that it can prevent Cu diffusion into the second insulating layer 7.

The step (g) of via-hole formation is carried out by patterning the second insulating layer through a resist-mask (not shown). In the step, the capping layer 6 on the conductive layer 4 has function of preventing halation of the exposure light, so that over exposure by reflected lights can be prevented, resulting in precise formation of via-holes 8.

The material of the conductive capping layer was selected from the group consisting of Ti, Ta, Mo, Cr, Al and W, and also their alloys, oxides and nitrides.

The step (h) of TiN, W layer formation is carried out by depositing, in turn, TiN layer and a W layer over the second insulating layer 7 and in the via-holes 8.

The step (i) of etching the TiN, W layer is carried out by removing TiN and W from the via-hole 8 by means of an etch back process to leave the diffusion barrier layer 3 and the conductive connecting portion 9 in the via-holes 8.

The step (j) of $SiO_2$ layer formation is carried out by forming a third insulating layer made of $SiO_2$ on the surface of substrate after the step (i).

The step (k) is a process of repeating steps (a) to (e) in order to form a second wiring system comprising an diffusion barrier layer 3 and a second Cu conductive layer 14 in trenche 13.

In the above embodiment, the Cu material is also used as a material of the second conductive layer 14. Other Cu alloys including AlSiCu can be used in place of Cu. In place of the conductive connecting portion made of W, a Cu conductive connecting portion may be used.

Further, if the step (k) is repeated, a more than triple embedded wiring system can be prepared.

Embodiment 2

Figure 8:
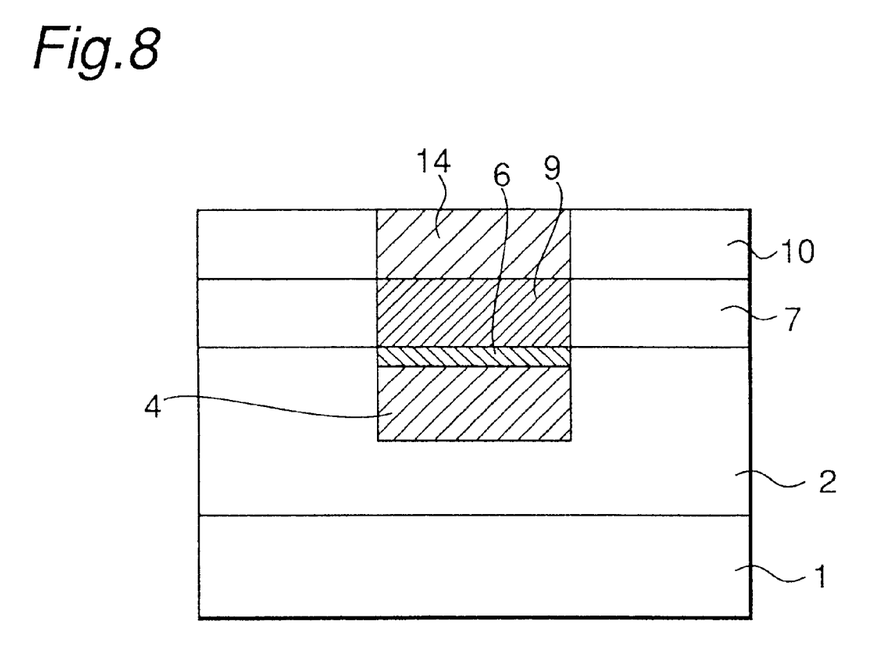
FIG. 8 is a sectional view showing a double embedded wiring system according to a third embodiment of the present invention.

FIG. 8 shows another double embedded wiring system prepared by using Al material as the conductive layer and FIGS. 9(a)–9(k) show a process for FIG. 8. The same numerals indicate the same elements or portions as shown in FIGS. 1 and 2(a)–2(k).

Figure 9A:
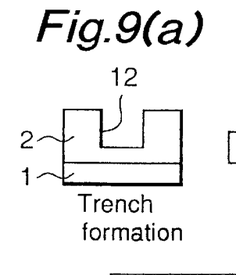
Figure 9B:
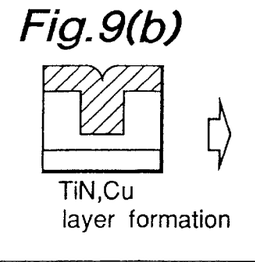
Figure 9C:
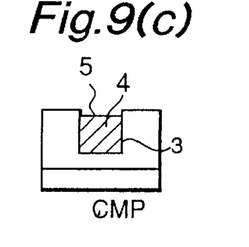
Figure 9D:
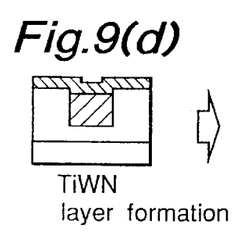
Figure 9E:
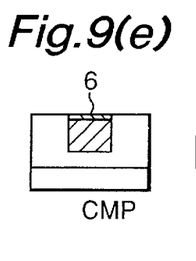
Figure 9F:
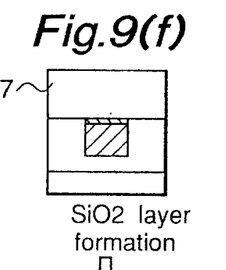
Figure 9G:
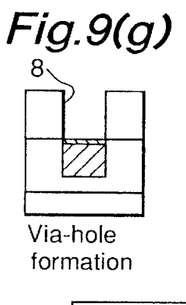
Figure 9H:
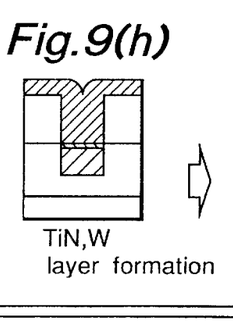
Figure 9I:
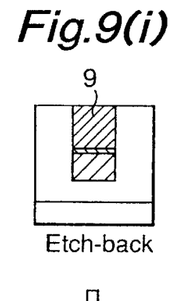
Figure 9J:
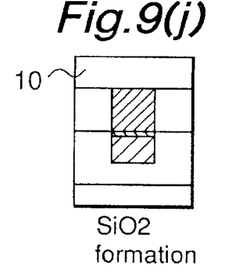
Figure 9K:
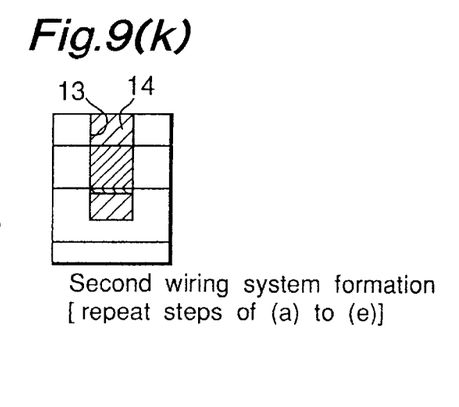

In case of using Al and its alloys (hereinafter referred to as the Al material) as the conductive layer, no diffusion into $SiO_2$ layers 2, 7 and 10 happens during a high temperature process (FIG. 9(f) and 9(j)) because the Al material has a lower diffusion coefficient.

In this case, there is not used the diffusion barrier layer 3 and there is no diffusion barrier layer formation process as shown in FIG. 2(b), 2(h), and 2(k). The other steps are almost the same as those of Embodiment 1 as shown in FIGS. 1 and 2.

Embodiment 3

As the conductive material, AlSiCu is used in place of the Cu material. In this case, the wiring system structure and the preparing steps are almost the same as in FIGS. 1 and 2. If the Cu content in the AlSiCu alloy is so low as to make the Cu diffusion negligible, the wiring system structure and the preparing steps of Embodiment 2 can be applied to this case. However, halation of the exposure light should be prevented in the same way as the Cu or Al conductive material, otherwise the patterning accuracy is reduced.

In the step (e), there is formed an anti-reflection layer 6 in order to prevent halation of the exposure light. If there is not provided the anti-reflection layer 6, the dimensional error increases from 4.3% (with the anti-reflection layer) to 7.3% (without the anti-reflection layer). Therefore, an anti-reflection layer improves the patterning accuracy remarkably.

Embodiment 4

Figure 10:
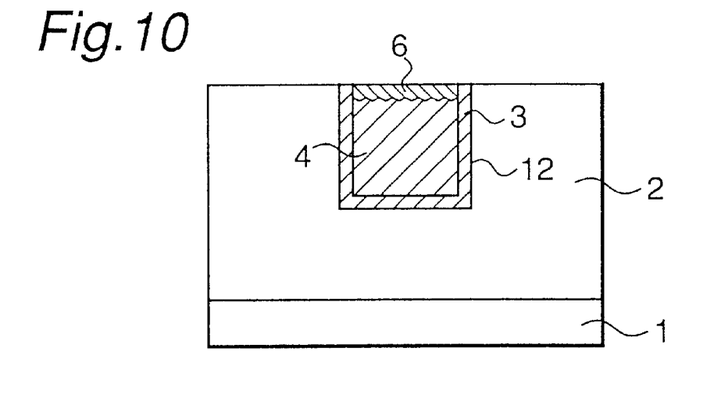
FIG. 10 is a sectional view of a fourth embodiment according to the present invention.

After the step of FIG. 2(c), the first conductive layer 4 is roughened at the surface by etching and then the anti-reflection layer 6 is formed by the steps (d) and (e) as shown in FIG. 10. The other steps are carried out in the same way as in FIG. 2. In this case, the surface roughness of the first conductive layer 4 makes the adhesion of the conductive capping layer 6 increase to prevent peeling of the capping layer 6 during the step (e) of CMP.

Embodiment 5

Figure 11:
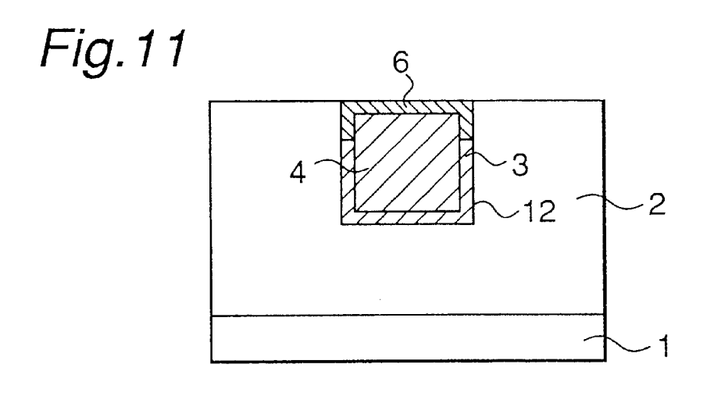
FIG. 11 is a sectional view of a fifth embodiment according to the present invention.

After the step of FIG. 2(c), the diffusion barrier layer 3 is made thinner at the top edge by etching and then the anti-reflection layer 6 is formed by the steps (d) and (e) as shown in FIG. 11. The other steps are carried out in the same way as in FIGS. 2(f)–2(k). In this case, the lowered top edges of the diffusion barrier layer 3 makes the conductive capping layer 6 enclose the conductive layer 4 to prevent peeling of the capping layer 6 during step (e), CMP polishing.

Embodiment 6

Figure 12:
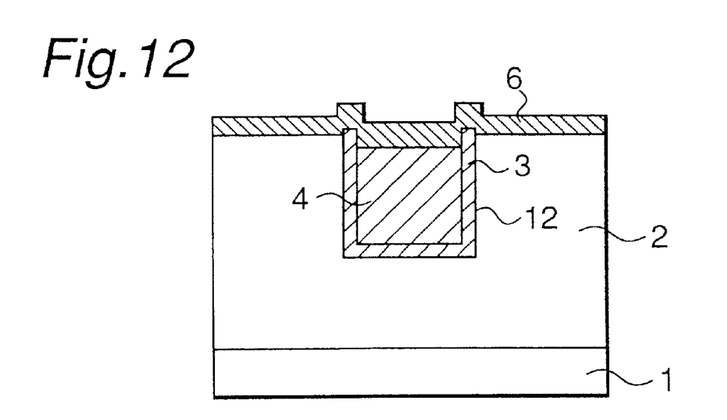
FIG. 12 is a sectional view of a sixth embodiment according to the present invention.

In the step of FIG. 2(c), the first insulating layer 2 surrounding the recess 5 is etched at the same time the recess is formed and then there is formed a TiWN layer on a resulting anti-reflection layer 3 having top edges projecting on the surface of the insulating layer 2 as shown in FIG. 12. The another steps are carried out in the same way as in FIGS. 2(a)–2(k).

In this case, the projecting top edges of the insulating layer 2 are polished together with TiWN layer to form a sectional structure shown in the step of FIG. 2(e). The projecting top edges of the diffusion barrier layer 3 prevent dusts generated in the step of CMP from reaching on the conductive capping layer 6, resulting in a decreased number of scratches on the surface of the conductive capping layer 6.

Embodiment 7

Figure 13:
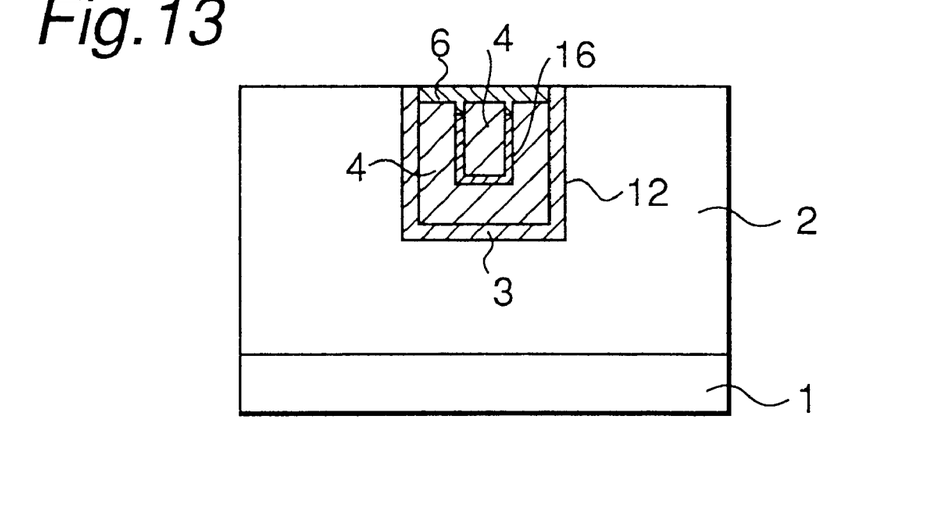
FIG. 13 is a sectional view of a seventh embodiment according to the present invention.

In the step of FIG. 2(b), a TiN layer, a Cu layer, and a layer of a material etched more easily than Cu and Cu are formed in turn on the first insulating layer 2 and then the steps (c) to (e) are carried out to obtain a sectional structure as shown in FIG. 13. The other steps are carried out in the same way as FIG. 2.

The easily etched material can be etched faster than Cu during the step (c) recess formation, so that a middle layer 16 deeply dug from the Cu surface can be obtained. When the conductive capping layer 6 is embedded in the steps (d) and (e), the conductive capping layer 6 also fills the deeply dug part, resulting in an increased adhesion between the first conductive layer 4 and the conductive capping layer 6, which prevents peeling, the conductive capping layer 6 during the step (e) of CMP.

Embodiment 8

Figure 14:
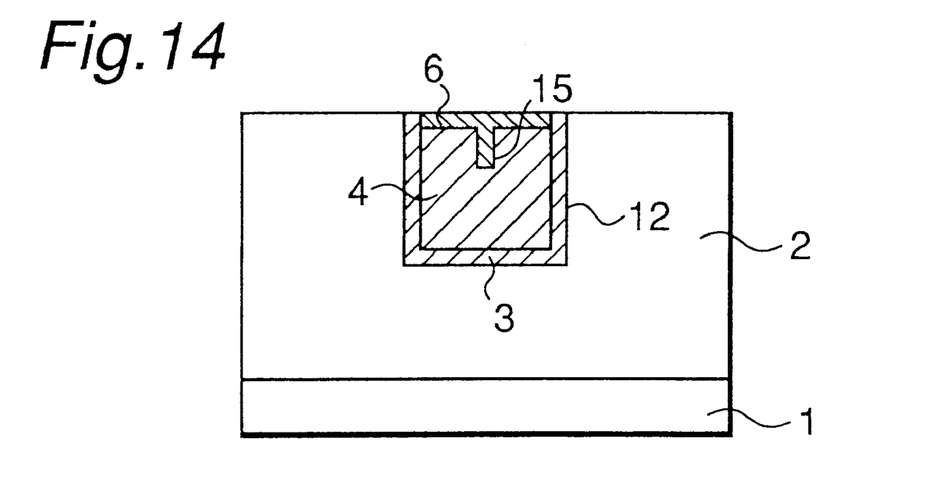
FIG. 14 is a sectional view of a eighth embodiment according to the present invention.

In the step (b) of the process shown in FIG. 2, the Cu layer is formed on the first insulating layer 2 to remain at the center of the trench 12 and then the steps (c) to (e) are carried out to obtain a sectional structure wherein the conductive capping material 6 enters in the groove as shown in FIG. 14. The other steps are carried out in the same way as FIG. 2.

The conductive capping layer 6 fills the groove 15, resulting in an increased adhersion between the first conductive layer 4 and the conductive capping layer 6, which prevent peeling of the conductive capping layer 6 during the step (e) of CMP.

As understood from the above description, according to the present invention, the conductive capping layer can prevent halation of the exposure light for making via-holes for embedding the connecting portion between the lower wiring and the upper wiring, so that the via-holes formation can be made precisely, resulting in preventing of wire breaking and lowering of the connecting resistance which causes a highly increased IC yield.

Further, according to the present invention, even if the wiring material is the Cu material which is easily oxidized, the capping layer can prevent oxidation of the wiring and thus prevent increasing of the wiring resistance, resulting in high performance of an IC.

Furthermore, according to the present invention, even if the wiring material is the Cu material which is easily diffuss, the capping layer can prevent diffusion of Cu in the wiring material, resulting a high reliability IC.

Although the present invention has been fully described by way of examples with reference to the accompanying drawings, it is to be noted here that various changes and modifications will be apparent to those skilled in the art. Therefore, unless such changes and modifications depart from the spirit and scope of the present invention, they should be construed as being included therein.

What is claimed is:

1. A method of preparing a multilevel embedded wiring system for an integrated circuit (IC) comprising a first wiring formation step, a first connecting portion formation step, and a second wiring formation step, wherein said first wiring formation step comprises
forming a first trench for a first embedded wiring in a first insulating layer disposed on a substrate, and embedding in the first trench, sequentially, a first conductive layer and a first conductive capping layer by depositing a conductive material on the first insulating layer and in the first trench, flattening a top surface of the conductive material by Chemical Mechanical Polishing (CMP) to leave the conductive material only in the first trench, forming a recess in the conductive material in the first trench, and embedding a conductive capping material in the recess to form the first conducting capping layer;

said first connecting portion formation step comprises forming a second insulating layer on said first insulating layer and said first conductive capping layer, forming a via-hole in a part of said second insulating layer at said first conductive capping layer, and embedding a conductive connecting portion in the via-hole and connected to said first conductive layer; and said second wiring formation step comprises forming a third insulating layer on said second insulating layer and said conductive connecting portion, forming a second trench for a second wiring in said third insulating layer at said conductive connecting portion, and embedding a second conductive layer in the second trench and connected to said conductive connecting portion.

2. The method of preparing a multilevel embedded wiring system according to claim 1, comprising forming diffusion barrier layers on walls of the first and second trenches.

3. The method of preparing a multilevel embedded wiring system according to claim 2, wherein the diffusion barrier layer is TiN and the first conductive layer is selected from the group consisting of Cu, its alloys, and compounds, including AlSiCu.

4. The method of preparing a multilevel embedded wiring system according to claim 1, including forming the recess by CMP overetching.

5. The method of preparing a multilevel embedded wiring system according to claim 4, wherein the CMF over-etching process uses an etching solution comprising an organic acid, such as propionic acid, acetic acid, picric acid, and salicylic acid, and hydrogen peroxide.

6. The method of preparing a multilevel embedded wiring system according to claim 1, including forming the recess by wet-etching with an etchant in a pH range of 2 to 6.5 or 7.5 to 13.

7. The method of preparing a multilevel embedded wiring system according to claim 1, including-forming the recess to a depth of 10 to 100 nm.

8. The method of preparing a multilevel embedded wiring system according to claim 1, wherein the conductive capping material is TiWN.

9. The method of preparing a multilevel embedded wiring system according to claim 1, wherein the conductive capping layer is selected from the group consisting of Ti, Ta, Mo, Cr, Al, W, and alloys, oxides, and nitrides of at least one member of the group.

* * * * *